(12) United States Patent
Charbonnier et al.

(10) Patent No.: US 10,854,494 B2
(45) Date of Patent: Dec. 1, 2020

(54) METHOD FOR PRODUCING AN INTERFACE INTENDED TO ASSEMBLE TEMPORARILY A MICROELECTRONIC SUPPORT AND A MANIPULATION HANDLE, AND TEMPORARY ASSEMBLY INTERFACE

(71) Applicant: COMMISSARIAT A L'ENERGIE ATOMIQUE ET AUX ENERGIES ALTERNATIVES, Paris (FR)

(72) Inventors: Jean Charbonnier, Grenoble (FR); Frederic-Xavier Gaillard, Voiron (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/025,360

(22) Filed: Jul. 2, 2018

(65) Prior Publication Data
US 2019/0006221 A1    Jan. 3, 2019

(30) Foreign Application Priority Data
Jul. 3, 2017    (FR) ...................................... 17 56269

(51) Int. Cl.
*H01L 21/683*    (2006.01)
*H01L 21/78*    (2006.01)
(Continued)

(52) U.S. Cl.
CPC ...... *H01L 21/6835* (2013.01); *H01L 21/2007* (2013.01); *H01L 21/56* (2013.01);
(Continued)

(58) Field of Classification Search
USPC ................................ 156/247, 701, 711, 719
See application file for complete search history.

(56) References Cited

U.S. PATENT DOCUMENTS 5,846,460 A * 12/1998 Matsuura ........... B01D 39/2079
                                                                 264/43
6,503,778 B1    1/2003 Yamauchi et al.
(Continued)

FOREIGN PATENT DOCUMENTS

| CA | 2 225 131 | 6/1998 |
|----|-----------|--------|
| FR | 2 773 261 A1 | 7/1999 |
| FR | 2 795 865 A1 | 1/2001 |

OTHER PUBLICATIONS

French Preliminary Search Report dated Mar. 16, 2018 in French Application 17 56269 filed on Jul. 3, 2017 (with English Translation of Categories of Cited Documents).
(Continued)

*Primary Examiner* — Sing P Chan
(74) *Attorney, Agent, or Firm* — Oblon, McClelland, Maier & Neustadt, L.L.P.

(57) ABSTRACT

Method for producing an interface for assembling temporarily a microelectronic support and a handle, comprising at least the formation of a first layer comprising at least one material capable of releasing at least one chemical species under the action of a physical-chemical treatment, the formation of a second layer comprising at least one material capable of receiving the at least one chemical species so as to cause its embrittlement, and the embrittlement of the interface by application of a heat treatment, such that the at least one species is released from the first layer and reacts with all or part of the material of the second layer.

18 Claims, 7 Drawing Sheets

(51) Int. Cl.
    *H01L 21/70*    (2006.01)
    *C23C 16/24*    (2006.01)
    *H01L 21/56*    (2006.01)
    *H01L 21/20*    (2006.01)

(52) U.S. Cl.
    CPC ........ *H01L 21/561* (2013.01); *H01L 21/7806* (2013.01); *C23C 16/24* (2013.01); *H01L 2221/6834* (2013.01); *H01L 2221/68327* (2013.01); *H01L 2221/68359* (2013.01); *H01L 2221/68381* (2013.01); *H01L 2224/94* (2013.01)

(56) References Cited

U.S. PATENT DOCUMENTS

| | | | |
|---|---|---|---|
| 2001/0039103 A1* | 11/2001 | Muramatsu | C30B 1/023 |
| | | | 438/486 |
| 2003/0008437 A1 | 1/2003 | Inoue et al. | |
| 2008/0223285 A1 | 9/2008 | Lee | |
| 2011/0204361 A1 | 8/2011 | Nishiki et al. | |
| 2017/0133395 A1* | 5/2017 | Or-Bach | H01L 27/11568 |

OTHER PUBLICATIONS

Foll, H. et al. "Formation and application of porous silicon", Material Science and Engineering R 39, 2002, pp. 49.

Charbonnier, J. et al. "Wafer level packaging technology development for CMOS Image Sensors Using Through Silicon Vias," $2^{nd}$ Electronics System Integration Technology Conference, IEEE, 2008, pp. 8.

\* cited by examiner

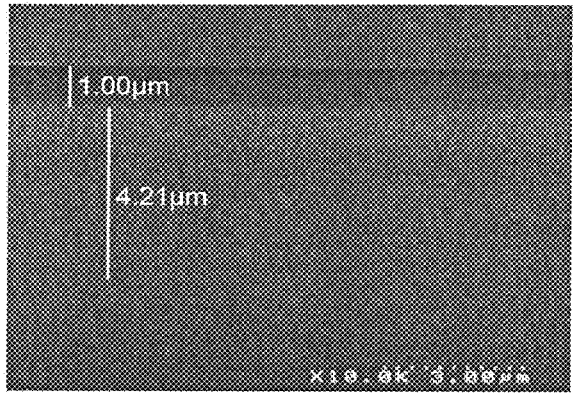
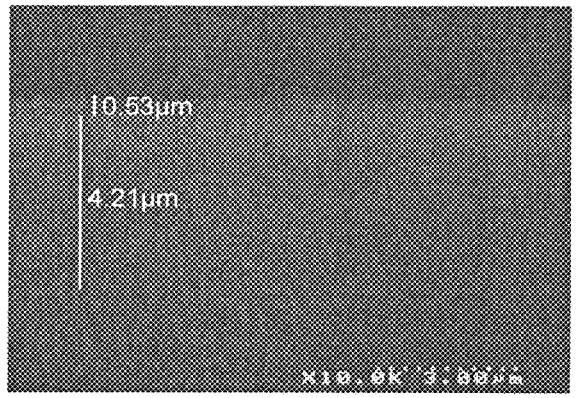
FIG.4A  FIG.4B
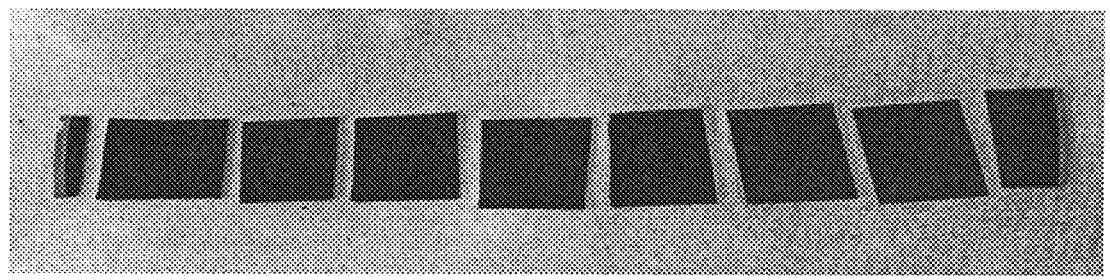
FIG.5A
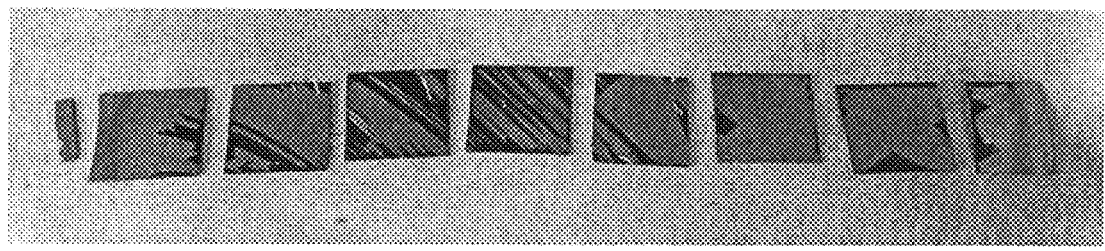
FIG.5B

METHOD FOR PRODUCING AN INTERFACE INTENDED TO ASSEMBLE TEMPORARILY A MICROELECTRONIC SUPPORT AND A MANIPULATION HANDLE, AND TEMPORARY ASSEMBLY INTERFACE

TECHNICAL FIELD AND PRIOR ART

The present invention relates to a method for producing an interface intended to assemble temporarily two elements, for example a manipulation handle and a microelectronic support, to a method for producing at least one microelectronic device, and to an interface for assembling temporarily at least two elements.

In the microelectronics field, in particular within the framework of 3D packaging and integration, an element, known as transport handle, is implemented making it possible to manipulate a thinned substrate, for example made of silicon, with a view to producing a microelectronic device on the substrate.

For example, transport handles may be implemented in the carrying out of steps of manufacturing chips, for example TSVs (Through Silicon Vias).

The so-called temporary handles are for example produced in a glass or silicon wafer.

The assembly of the handle and the substrate is carried out:

either by bonding implementing organic materials, for example polymers. This bonding is advantageous because it enables the removal of the handle by simple heating to around 200° C. On the other hand, it cannot be used if it is wished to carry out methods at temperatures above 350° C.–400° C. Moreover, the bonding material has to be spread out on each handle, which implies non-negligible production costs.

or by direct or metallic/eutectic bonding. This bonding has the advantage of being resistant to temperatures above 400° C. and may thus be used for microelectronic methods implementing temperatures above 400° C. But this bonding is permanent, indeed no industrial method exists enabling the removal of the handle without its destruction. The removal of the handle is then achieved by its consumption by mechanical erosion. The handle thus cannot be used again.

The documents FR2773261 and FR2795865 describe methods for transferring thin films. The thin films are produced on a substrate, inclusions are formed in the substrate at a distance from the thin film. Gaseous species are next implanted in the inclusions then forming microcavities which determine a fracture plane. This method is relatively complex because it comprises notably the step of implantation of gaseous species.

The document CA2225131 describes a method for transferring a carrier layer onto a flexible film comprising the bonding of a flexible film on a substrate comprising a porous layer and next the peeling of the flexible film, which carries with it a part of the porous layer. This technique can only apply in the case of a flexible film and cannot apply to a support comprising microelectronic devices or to a handle.

DESCRIPTION OF THE INVENTION

It is consequently an aim of the present application to offer an interface for temporarily assembling two elements in a microelectronic method, enabling easy separation of the two elements, and offering an assembly having a sufficient resistance to the temperatures normally implemented in microelectronic methods.

The aforementioned aim is attained by a stack of layers intended to form an interface between a first element, for example a temporary handle, and a second element, for example a microelectronic support, said stack comprising at least one first layer of material and one second layer of material, the first layer being capable of emitting a chemical species during a physical-chemical treatment, and the second layer being capable of receiving said species so as to embrittle mechanically the interface and to enable facilitated separation between the first element and the second element.

Thanks to this stack, the assembly between the handle and the microelectronic support is carried out without bonding implementing organic materials, it is thus possible, during integration, to use microelectronic methods involving temperatures greater than or equal to 400° C. It further offers the advantage of making it possible to recover the handle and thus to reuse it with a view to the manufacture of other microelectronic devices. The result is considerable savings in terms of cost of material and time, the method no longer requiring spreading out the bonding material on each handle.

In other words, a stack of at least two layers is produced, of which one at least is capable, due to a physical-chemical treatment, of releasing at least one chemical agent embrittling at least in part the other layer. The means for its embrittlement are thus integrated in the interface, said means being "activated" at the desired moment.

The embrittlement may take place in the second layer or at the level of the contact zone between the two layers.

The method for producing the temporary assembly separation interface comprises the steps of:

formation of a layer comprising at least one material capable of releasing one or more chemical species under the action of a physical-chemical treatment, formation of a layer comprising at least one material capable of receiving the one or more chemical species so as to cause its embrittlement, the layers being at least in part in contact, optional embrittlement.

The layer made of at least one material capable of releasing one or more chemical species may be produced before or after having produced the layer comprising at least one material capable of receiving one or more chemical species.

In one embodiment, the embrittlement is at least in part chemical, the at least one chemical species given off by the first layer reacts with at least one part of the second layer to form one or more fragile materials, so as to produce an interface enabling a facilitated separation between the first element and the second element.

In another embodiment, the embrittlement is at least in part physical, the first material degasses at least one chemical species received in the second layer, by an overpressure effect, the second layer is at least in part embrittled.

For example, the first layer comprises amorphous silicon, the second layer is porous silicon and the physical-chemical treatment is a heat treatment at a temperature below 500° C. During the heat treatment, the amorphous silicon degasses hydrogen which diffuses into the porous silicon. By oxidation-reduction reactions, the porous silicon is embrittled. A phenomenon of overpressure may also appear, further favouring this embrittlement.

The embrittlement treatment may be carried out before, after, or even during the technological steps for producing the microelectronic device.

Finally the first element and the second element are separated.

Advantageously the second layer may undergo a prior treatment to make it more sensitive to the one or more chemical species released by the first layer.

The present application then relates to a method for producing an interface intended to assemble temporarily a first and a second element, comprising at least:

a) formation of a first layer comprising at least one material capable of releasing at least one chemical species under the action of a physical-chemical treatment, b) formation of a second layer comprising at least one material capable of receiving the at least one chemical species so as to cause its embrittlement, the first layer and a second layer being at least in part in contact.

In an advantageous example, the formation of the first layer is such that the at least one chemical species is trapped in the material of the layer.

The second layer may be at least in part porous.

In one example, during the formation of the second layer, an external zone offering a porosity less than a central zone is produced, designated exclusion zone.

In an exemplary embodiment, step a) is carried out by deposition of amorphous silicon by CVD or PECVD, and the second layer is at least in part made of porous silicon.

The production method may comprise a chemical treatment of the second layer, among an oxidation by plasma, an oxidation by liquid process, such as oxidation in peroxide medium, etc., a gaseous oxidation treatment, a thermal oxidation treatment, etc.

The present application also relates to a method for temporarily assembling a first element and a second element comprising:

the production of an interface according to the method described in the application, the assembly of the first element and the second element through said interface such that the first layer is on the side of the second element and the second layer is on the side of the first element.

a step of embrittlement of the interface such that the at least one species is released from the first layer and reacts with all or part of the material of the second layer.

The second layer is for example produced on the front face of the first element.

In one example, the embrittlement step takes place before the assembly.

Advantageously, at the end of the embrittlement step, the adherence energy along a plane transversal to a stack direction of the first and second layers is less than or equal to 1 $J/m^2$.

The embrittlement step may be a heat treatment between 250° C. and 500° C.

The present application also relates to a method for producing at least one part of at least one microelectronic device implementing the assembly method described in the application, wherein the first element is a temporary handle and the second element is a microelectronic support, said method comprising a step of removal of the handle after the embrittlement step.

The present application also relates to a method for producing a thin film implementing the assembly method described in the application, wherein the first element is a support substrate and the second element is a thin film, said method comprising a step of removal of the support substrate after the embrittlement step.

The present application also relates to an interface intended to assemble temporarily a first and second element comprising at least one first layer comprising at least one material capable of releasing at least one chemical species under the action of a physical-chemical treatment, and at least one second layer comprising at least one material capable of receiving the one or more chemical species so as to cause its embrittlement.

For example, the first layer is made of amorphous silicon and the second layer is made of porous silicon.

Advantageously, the second layer has a porosity comprised between 20% and 80%.

The thickness of the first layer may be comprised between 100 nm and 10 μm and that of the second layer may be comprised between 100 nm and 100 μm.

The interface may also comprise an encapsulation layer covering the first layer, for example made of $SiO_2$.

BRIEF DESCRIPTION OF THE DRAWINGS

The present invention will be better understood on the basis of the description that follows and the appended drawings in which:

FIG. 4A is a scanning electron microscope sectional view of a stack of a layer of porous silicon and $SiO_2$ before a heat treatment, FIG. 4B is a scanning electron microscope sectional view of a stack of a layer of porous silicon and $SiO_2$ after a heat treatment, the thickness of the layer of $SiO_2$ being lower than in FIG. 4A because the sample has undergone a step of chemical mechanical polishing of the silicon oxide in addition to the heat treatment, FIG. 5A is view of different stacks comprising porous silicon and $SiO_2$ after a heat treatment at 400° C. under $N_2$ for 2 h, FIG. 5B is a view of different interfaces comprising a layer of porous silicon and a layer of amorphous silicon after a heat treatment at 400° C. under $N_2$ for 2 h.

DETAILED DESCRIPTION OF PARTICULAR EMBODIMENTS

Figure 1:
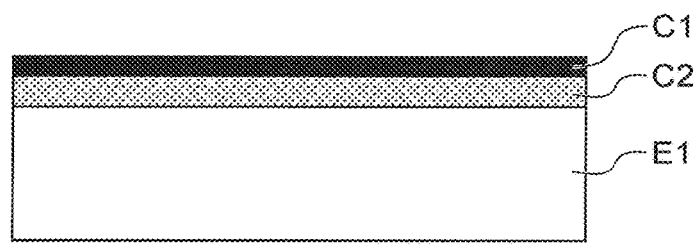
FIG. 1 is a schematic representation of an example of a temporary assembly interface.

In FIG. 1 may be seen an exemplary embodiment of a stack comprising the interface.

The stack comprises a first element E1, for example a temporary manipulation handle, and an interface I formed on the handle E1. The interface comprises a first layer C1 and a second layer C2, the layer C2 being on the side of the first element E1.

In the example represented, the layer C1 and the layer C2 are directly in contact. According to one alternative, the layers C1 and C2 may only be in part in direct contact. According to a further alternative, a layer may be interposed between all or part of the layers C1 and C2, for example a layer "permeable" to the chemical species released by the layer C1 is interposed between the layers C1 and C2.

The handle is for example made from a silicon substrate.

The layer C1 comprises at least one material capable of releasing one or more chemical species under the action of a physical-chemical treatment and the layer C2 comprises at least one material capable of receiving the one or more chemical species so as to cause its embrittlement.

In the present application, "ability to receive a chemical species" is taken to mean the fact of being the seat of any physical and/or chemical reaction with the chemical species, for example an adsorption and/or an absorption and/or an oxidation-reduction reaction.

The quantity of chemical species trapped in the layer C1 depends, in a non-limiting manner, on the conditions and parameters of the deposition method, such as the deposition temperature, the gas ratio, its thickness, etc. The layer C2 is such that it favours the diffusion of chemical species in its volume. In a very advantageous manner, the layer C2 is at least in part porous.

The method for producing the temporary assembly interface comprises the steps of:
  formation of a layer C1 comprising at least one material capable of releasing one or more chemical species under the action of a physical-chemical treatment,
  formation of a layer C2 comprising at least one material capable of receiving the one or more chemical species so as to cause its embrittlement,
  the layers C1 and C2 being at least in part in contact,
  optionally an embrittlement step.

The layer C1 may be produced before or after the layer C2.

The layer C1 has for example a thickness comprised between 100 nm and 10 µm, advantageously equal to around 1 µm.

The embrittlement step may cause a physical-chemical modification of the layer C2 and/or a structural modification of the layer C2 due to the overpressure that would be applied to it.

The stack may for example be interposed between a handle E1 and one or more microelectronic devices.

In one exemplary embodiment, the layer C2 undergoes a treatment favouring physical and/or chemical reaction(s) with the chemical species released by the layer C1.

A particular example of stack will now be described.

The first layer C1 is made of amorphous silicon, the second layer C2 is made of porous silicon and the handle E1 is a silicon substrate.

The second layer C2 is produced directly on the front face of the handle E1, for example by electrochemical attack in hydrofluoric acid medium. This technique is well known to those skilled in the art. The document "Formation and application of porous silicon", Material Science and Engineering R 39(2002) 93-141 describes different electrochemical techniques for forming porous silicon.

The porous layer C2 may be obtained either from films with constitutive porosity for which the porosity is derived directly from synthesis, for example the porous silica obtained by sol-gel method of silicon based aerogel type, by electrochemical process making it possible to form porous metal materials, such as porous alumina, porous silicon, etc., or from films that are next made porous by subtractive porosity for which the porosity results from the selective degradation of a part contained in the layer to be porosified, called pore-forming material. These pore-forming materials are for example organic macromolecules (polymers, sugars, surfactants) eliminated using methods of calcination, mild oxidation (plasma, UV, ozone), heat treatments or solubilisation.

The layer C2 may be produced from one or more organic materials, inorganic materials, for example a porous dielectric material based on hydrogen or methyl silsesquioxane.

The porosity level, the size of the pores and the thickness of the porous layer may be determined by choosing the nature of the silicon substrate used, for example by choosing its p or n type, its level of resistivity and the conditions of the method, among for example the electrolyte solution, the level of current, the level of voltage, the illumination, the duration, etc. Thus, structures having homogenous nanocrystallites or formed of pillars interlaced with silicon may be obtained.

The porous layer C2 preferably comprises a size of pores comprised between several nanometres and several tens of nanometres, and preferably a porosity level comprised between 20% and 80%. Porosity measurement methods are well known to those skilled in the art. For example, one of the methods uses several weighing measurements: a weighing measurement (M1) before porosification, a weighing measurement after porosification (M2) and a weighing measurement after removal of the porous layer (M3). These three values M1, M2, M3 make it possible to deduce mathematically the thickness and the porosity level of the porous silicon layer. Another method uses weighing measurements before and after porosification and the thickness measurement of the porous layer to determine the porosity level. The thickness of the porous layer is for example measured by observation of a section of the layer by scanning electron microscope.

The porous silicon layer C2 has for example a thickness comprised between 100 nm and 100 µm, advantageously equal to around 5 µm. A layer C2 made of porous silicon is particularly suited within the scope of micro- and nanotechnological methods, which mainly use silicon substrates.

In an advantageous example, the layer C2 may undergo one or more physical-chemical treatments before its assembly with the layer C1, in order to modify superficially or in depth the very chemical nature of the porous material, for example the physical-chemical treatments may be an oxidation treatment for example by oxidising plasma, by liquid process, such as oxidation in peroxide medium, etc., a gaseous oxidation treatment, a thermal oxidation treatment, etc. Such treatments can make it possible to favour the reaction with the chemical species released by the layer C1 in order to facilitate the embrittlement step.

Figure 2:
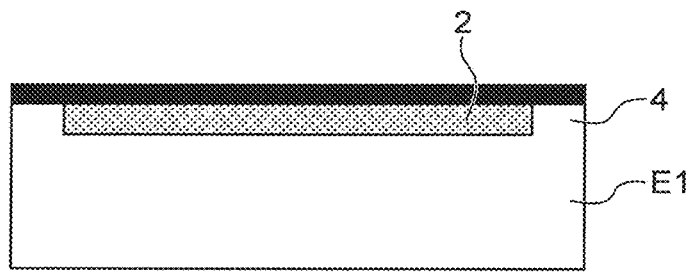
FIG. 2 is a schematic representation of another example of a temporary assembly interface.

In an exemplary embodiment represented in FIG. 2, the layer C2 is in part porous. It comprises a porous central portion 2 and a dense outer peripheral portion 4 surrounding in a continuous manner the porous portion 2. The dense peripheral portion 4 is such that it makes it possible to trap, at least temporarily, the chemical species released by the layer C1 in the porous portion 2, thus they remain at least in part confined in the porous portion 2, which favours the reaction(s) with the material(s) of the porous portion. Moreover, it protects the porous layer and ensures a mechanical maintaining of the stack in the case where the porous layer could be very embrittled and ensures a cohesion of the handle-devices assembly during technological methods applied to the stack.

The external portion 4, designated exclusion zone, has for example a thickness of several millimetres, preferably of the order of 3 mm.

This exclusion zone may advantageously be formed directly during the method of porosification of the layer C2, using the exclusion zone intrinsic to certain porosification methods, implementing for example a double tank system, i.e. by masking.

The layer C1 made of amorphous silicon is formed on the layer C2. The layer C1 made of amorphous silicon is such that it releases gaseous hydrogen when it is subjected to a sufficient temperature, for example comprised between 250° C. and 500° C. advantageously equal to 350° C. The layer C1 is for example deposited on the layer C2 by PVD, by CVD (Chemical Vapour Deposition), and advantageously by PECVD (Plasma Enhanced Chemical Vapour Deposition) at a temperature comprised between 150° C. and 400° C., advantageously equal to around 240° C. In the case of PECVD, the trapping of hydrogen results from the decomposition of the precursor in the layer. The layer C1 has for example a thickness comprised between 100 nm and 10 µm, advantageously equal to around 1 µm.

During a following step, the interface undergoes a treatment aiming to embrittle mechanically the interface and in particular the layer C2.

In the present application, "embrittlement treatment" is taken to mean a treatment aiming to obtain an adhesion energy of the stack of layers C1 and C2 with respect to the silicon substrate less than or equal to around 1 $J/m^2$ after the treatment. In the case of an amorphous silicon/porous silicon interface, the adhesion energy is greater than 2 $J/m^2$.

The adhesion energy can be measured by techniques well known to those skilled in the art, for example by insertion of a blade or 4-point bending measurement.

The heat treatment is at low temperature, which is compatible with the microelectronic device(s) produced on the layer C1.

During the heat treatment, the amorphous silicon releases gaseous hydrogen of which at least a part is going to enter into contact with the layer C2 and react with the porous silicon and to embrittle it, which next makes it possible to remove the handle E1 by fracturing at the level of the layers C1 and C2.

During the release of hydrogen and its reaction with the porous silicon, the layer C2 made of porous silicon advantageously forms a buffer layer making it possible to conserve the planeness of the stack, and to avoid bubbles or blisters and planeness defects that would result therefrom. In the absence of layer C2, there is a risk that blisters appear at the level of the layer C1 preventing a later integration on account of planeness defects.

In the example of an interface comprising amorphous silicon and porous silicon, the embrittlement treatment is advantageously a heat treatment at temperatures comprised between 250° C. and 500° C. and advantageously equal to around 350° C. The heat treatment is advantageously carried out under nitrogen atmosphere.

The duration of the heat treatment may be comprised between 10 min and 10 hours, preferably it is of the order of 2 h. The duration of the heat treatment depends among other things on the thickness of the layers C1 and C2.

At the end of the heat treatment, it is not necessary that reactions with the chemical species released by the layer C1 take place in the entire volume of the layer C2, notably in the entire transversal section of the layer C2. It may be sufficient that a partial zone on the surface, in the volume and/or in the thickness of the layer C2 in contact with the layer C1 have reacted to enable separation. It may also be a zone arranged at a distance from the layer C1; in this case during the separation a part of the layer C2 remains on the layer C1.

Indeed, it is sought to embrittle the interface C1 and C2 by the reactions with the chemical species released by the layer C1 and reacting with the layer C2.

In an alternative embodiment, the layer C2 may comprise non-porous patterns, for example obtained by masking of certain zones of the porous layer C2 by lithography method. These non-porous patterns can make it possible to reinforce the interface.

Figure 3A:
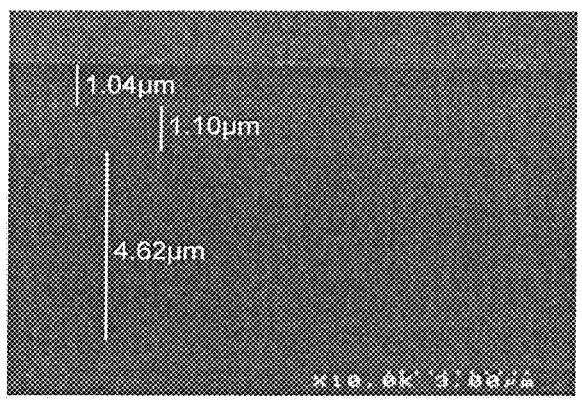
FIGS. 3A and 3B are scanning electron microscope sectional views of an example of interface before and after an embrittlement treatment respectively.
Figure 3B:
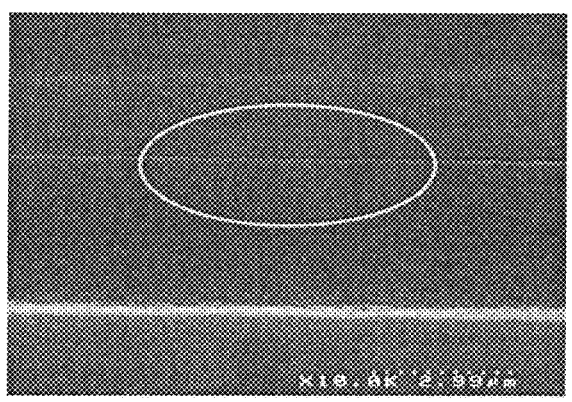

In FIGS. 3A and 3B may be seen scanning electron microscope sections of the stack of FIG. 1 with the element E1 made of Si, the layer C2 made of porous silicon and the layer C1 made of amorphous silicon before and after a heat treatment at 400° C. under $N_2$ for 2 h respectively. The appearance of an embrittled zone 6 may be noted. The embrittled zone 6 appearing during the heat treatment is situated at the interface between the layer C1 and the handle layer C2.

As a comparison, in FIGS. 4A and 4B may be seen scanning electron microscope sections of the stack of FIG. 1, with the element E1 made of Si, a layer C2 made of porous silicon and a layer C1' made of $SiO_2$ deposited by PECVD, before and after a heat treatment at 400° C. under $N_2$ for 2 h respectively.

No embrittlement zone appeared following the heat treatment.

In FIG. 5B, which shows optical views of porous Si, amorphous Si stacks after a heat treatment at 400° C. under $N_2$ for 2 h, it may be noted that the layer C1 disintegrates into lamina (visible in photo 5B). Whereas in FIG. 5A representing optical views of porous Si, $SiO_2$ stacks after a heat treatment at 400° C. under $N_2$ for 2 h, no modification is observed.

The embrittlement treatment is advantageously carried out at low temperatures, preferably below 500° C. It ensures the embrittlement of the layer C2 or of the interface C1 and C2, which makes it possible to lower the adherence energy between the handle and the layer C2 to values of the order of 1 $J/m^2$. With such an adherence energy, the removal of the handle is then possible without damaging the microelectronic support.

Advantageously, the heat treatment is at 200° C. for 2 h under non-controlled atmosphere. The temperature of the order of 200° C. is very interesting because it is not destructive and does not damage the integrations, notably tin based brazings, which do not withstand temperatures above 280° C. without suffering degradation.

The embrittlement treatment may take place before the production or transfer of the microelectronic devices on the layer C1, during the production or transfer of the microelectronic devices on the layer C1 or after the production or transfer of the microelectronic devices on the layer C1.

Furthermore, it may be envisaged that the embrittlement treatment is carried out simultaneously with one step or several steps of producing the microelectronic device(s), if said step(s) implement a thermal budget adapted to said embrittlement.

A separation may result from the embrittlement treatment without said separation needing to exert a mechanical action at the level of the interface. In this case, the embrittlement treatment and separation take place after production of the microelectronic devices.

According to another exemplary embodiment, the embrittlement treatment may be a UV treatment.

According to another exemplary embodiment, the embrittlement treatment may comprise a heat treatment and a UV treatment.

Preferably, the embrittlement treatment takes place before the transfer of the devices on the layer C1.

The separation may be carried out according to different techniques known to those skilled in the art, chosen in a non-limiting manner from peeling, the use of a water jet, acid chemical attack, alkaline chemical attack by liquid or gaseous process.

After separation, the handle may advantageously be reused, either by carrying out directly a new deposition of the layer C1 if the entire layer C2 has not been consumed during the preceding embrittlement step, or by forming a new layer C2 and a new layer C1, in this case if a residual layer C2 exists a step of cleaning and/or consumption thereof according to conventional microelectronic techniques (for example by immersion in a chemical bath of SC1, by TMAH attack, etc.) has taken place prior to the formation of a new layer C2.

The different alternatives and possibilities, for example physical-chemical treatments, embrittlement, separation, described in relation with the above example wherein the layer C1 is made of amorphous Si and the layer C2 is made of porous Si apply to the examples that follow. It will be understood that the treatments are adapted as a function of the materials and or the embrittlement mechanism implemented.

According to another exemplary embodiment, the layer C2 could comprise one or more non-porous metal materials or metal alloys. This or these material(s) in all or part may for example have an aptitude to adsorb the hydrogen given off by the layer C1 to form a hydride. For example, the layer C2 may comprise titanium (solid TiHα solution), vanadium, Nb, Ni or other transition metals and alloys of transition metals such as $Zr_7Ni_{10}$. Indeed, hydrogen has the capacity to embrittle metals according to a mechanism well known to those skilled in the art, designated "hydrogen embrittlement", by interaction with the dislocations of the network, the hydrogen atoms leading to an important reduction in the plastic deformation capacity of the metal which becomes fragile and/or while forming directly a metal hydride by precipitation, said hydride have the property of being brittle. These materials have the advantage of enabling good migration of hydrogen.

These materials could for example be deposited by electrochemical process, by means of vacuum deposition techniques, by chemical process (sol gel, etc.) or spin coating, etc. In particular, the transition metals and alloys thereof are for example deposited by physical vapour deposition (PVD) or co-PVD.

The layer C1 may comprise any material capable of releasing or degassing hydrogen or other chemical species during the embrittlement treatment. For example, the layer C1 may comprise silicon oxides or nitrides deposited at low temperature, preferably less than 200° C., or non-stoichiometric silicon oxy-nitrides $SiO_xN_y$ capable of degassing during rises in temperature greater than their deposition temperature. The temperature of deposition of the oxynitrides is for example comprised between 150° C. and 400° C.

According to another example, the layer C1 can release $O_2$ or $NH_3$.

During the PECVD method, the decomposition of the precursors leads to the formation of chemical elements (so-called free radicals of H*, O* type) which can be adsorbed or bond via low energy bonds, of Van der Walls type, to the material of the layer C1.

When the chemical species released are $H_2$, $O_2$ and $NH_3$, during the embrittlement step one or more oxidation-reduction reactions take place with the material or materials of the layer C2.

According to another exemplary embodiment, the layer C1 comprises silicone based polymers which, when they are heated for example to at least 300° C., give off volatile organic compounds, such as for example organic pore-forming materials of DEMS (diethoxymethyloxiranylsilane) and NBD (norbornadiene) type, the layer C2 comprises a porous material, for example made of porous silicon. The embrittlement mechanism is then overpressure.

According to another exemplary embodiment, the layer C1 comprises a dielectric organic material, for example a polymer, the layer C2 comprises at least one porous material based for example on Si, Ge, SiGe, a porous dielectric such as $SiO_2$, SiN, SiON, a porous metal, a porous organic material deposited for example by ICVD (initiated chemical vapour deposition), for example a porous polymer.

During the embrittlement step, the layer C1 can release $N_2$ or one or more hydrocarbons. The embrittlement is obtained by overpressure.

According to yet another exemplary embodiment, it is envisaged to produce a stack of a layer of material C1" capable of storing and releasing chemical species and a layer of material C2 capable of receiving these chemical species. After production of the stack the chemical species are introduced into the layer C1" to form a layer C1. For example, it is possible to carry out an ion implantation of chemical elements for example $H^+$ in the layer C1".

In another exemplary embodiment, it is possible to provide to produce the layer C2 by porosification of the front face of the handle and to produce on the other hand a stack with a view to the production of microelectronic devices comprising on the rear face the layer C1, the layers C1 and C2 are next assembled.

In a particularly advantageous example, the stack comprises an additional so-called encapsulation layer C3 formed on the layer C1 opposite the layer C2. This layer ensures an at least partial confinement of the chemical species released by the layer C1, forcing them to diffuse into the layer C2.

The layer C3 has a thickness of at least 100 nm and preferably equal to around 500 nm. The layer C3 is for example made of SiN, $SiO_2$, or a dielectric organic material.

The encapsulation layer C3 may be removed prior to the production of the microelectronic device(s). It may advantageously be conserved and serve in the production of the microelectronic device(s).

Moreover, the encapsulation layer C3 advantageously makes it possible to transfer a stack comprising the microelectronic device(s) onto the handle-assembly interface assembly. For example a layer C3 made of $SiO_2$ enables an oxide-oxide bonding, the microelectronic stack comprising on the rear face an oxide layer.

An example of method for producing a device of FO-WLP (Fan Out Wafer Level Packaging) type, implementing a temporary assembly interface according to the invention will now be described.

FO-WLP consists in connecting heterogeneous electronic circuits in a same packaging or assembly mainly including so-called moulding materials.

Figure 6A:
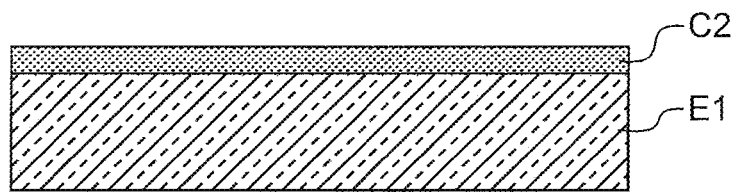
FIGS. 6A to 6I are schematic representations of the steps of an example of method for producing a device of FO-WLP type.

In FIG. 6A is represented an assembly comprising a handle E1 and the layer C2, formed on the front face of the handle for example by a porosification method.

During a following step, the layer C1 made of amorphous silicon is formed on the layer C2, for example by CVD. The element obtained is represented in FIG. 6B.

Figure 6B:
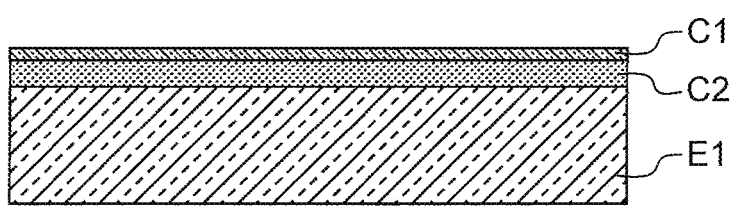

During a following step, the element of FIG. 6B undergoes an embrittlement treatment. In this example, it is a heat treatment at a temperature comprised preferably between 250° C. and 500° C. The layer C2 has been embrittled.

Figure 6C:
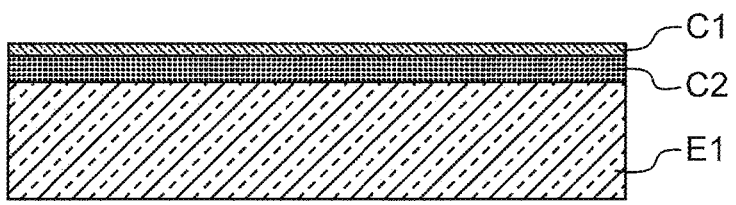

The element obtained is represented in FIG. 6C.

During steps 6D to 6G, the microelectronic device(s) are produced on the layer C1.

Figure 6D:
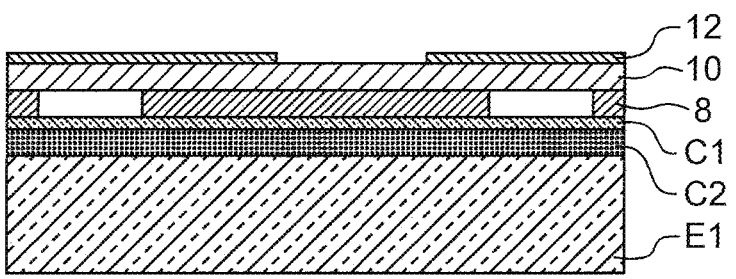

A UBM (Under Bump Metallurgy) layer 8, a redistribution layer 10 and inter-chip interconnections 12 are produced. The element obtained is represented in FIG. 6D. The layer 8 is a metal stack which can comprise titanium, nickel and gold to obtain a surface facilitating the position of the bumps, thanks to good wetting during re-melting of the beads and good protection against corrosion while awaiting later beading or mounting on a board.

During a following step one or more active chips 14 are transferred onto the interconnections 12.

Figure 6E:
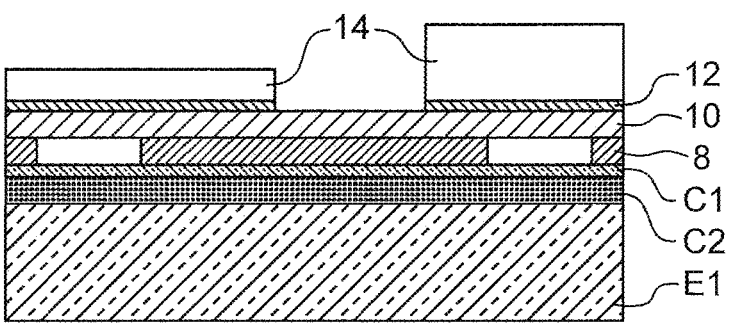

The element obtained is represented in FIG. 6E.

During a following step, a step of overmoulding on the chips 14 is carried out, for example a material 16 including an epoxy matrix and silica beads called "fillers".

Figure 6F:
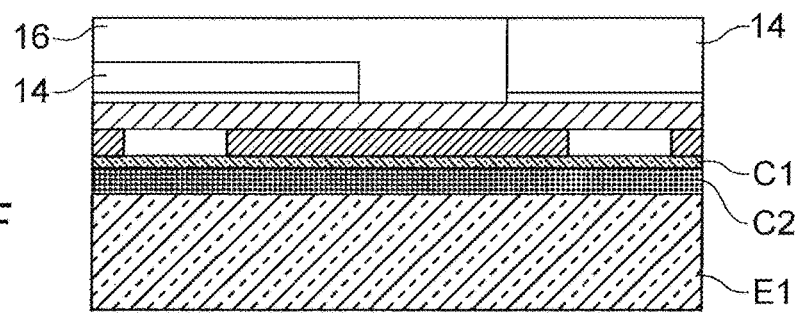

The element obtained is represented in FIG. 6F.

During a following step, a thinning of the chips and of the overmoulding is carried out.

Figure 6G:
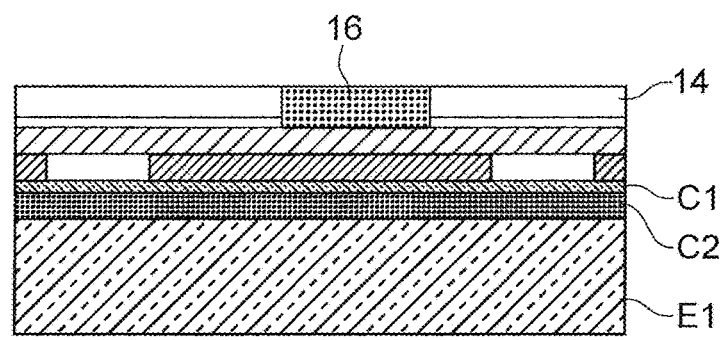

The element obtained is represented in FIG. 6G

During a following step, the handle E1 is removed for example by peeling. The residual layer C1 is removed for example by abrasion.

Figure 6H:
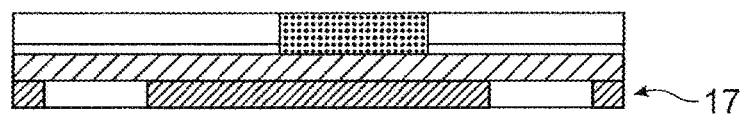

The element 17 obtained is represented in FIG. 6H.

Figure 6I:
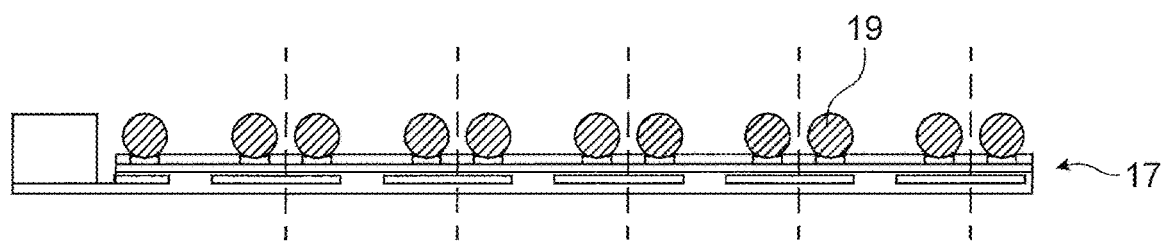

During a following step, the putting in place of the connection beads 19 on the rear face of the element of FIG. 6H takes place and the element is cut at the level of the dotted lines (FIG. 6I).

In FIGS. 7A to 7D may be seen another example of method implementing a temporary assembly interface with an exclusion zone.

The exclusion zone results for example from the method of porosification of the layer C2. The starting point is the handle-release interface assembly represented in FIG. 2.

Figure 7A:
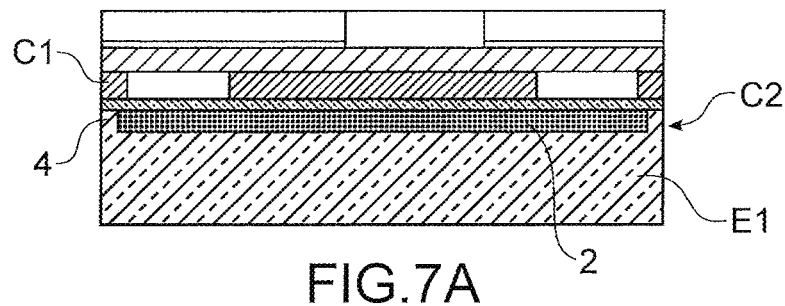
FIGS. 7A to 7D are schematic representations of the steps of an alternative of the production method of FIGS. 6A to 6I, FIGS. 8A to 8H are schematic representations of the steps of an example of method for producing a microelectronic device comprising via-last TSVs with a view to 3D integration.

The steps 6A to 6G described above are carried out. The element obtained is represented in FIG. 7A.

During a following step, the stack is prepared to separate the handle and the microelectronic stack.

Firstly a profiling is carried out, for example by mechanical erosion, of the microelectronic stack and of the layer C1 so as to reach the porous zone of C2.

Figure 7B:
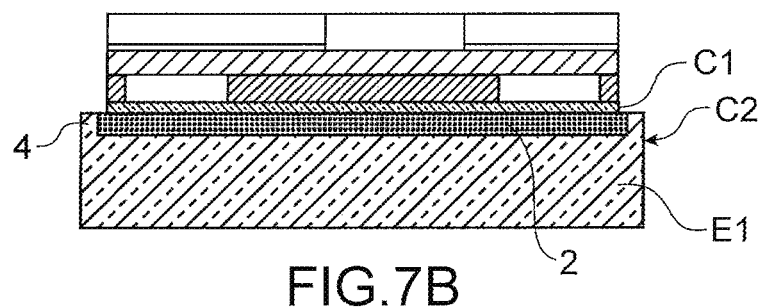

The element obtained is represented in FIG. 7B.

During a following step, the handle is removed for example by peeling.

Figure 7C:
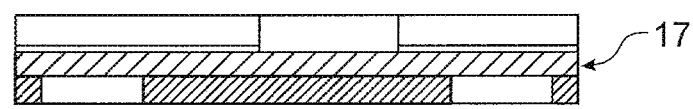

The element obtained is represented in FIG. 7C.

Figure 7D:
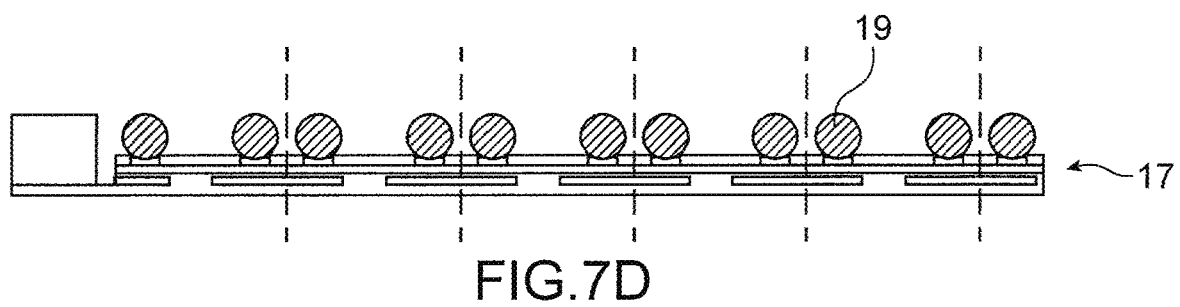

During a following step, the layer C1 is removed and connection beads are put in place on the rear face of the element of FIG. 7C and the element is cut at the level of the dotted lines (FIG. 7D).

This method implementing a temporary assembly interface according to the invention has, compared to a FO-WLP method wherein the handle is assembled by a polymer adhesive, the following advantages:
- a globally reduced manufacturing cost due to the absence of polymer adhesive,
- better resistance at temperatures above 300° C.,
- the production of an integration with a dense rerouting system, for example with wired connections made of copper having critical dimensions of the order of 5 μm width for 5 μm minimum space. Indeed, thanks to the invention, the surface state on the amorphous silicon of the stack having undergone an embrittlement heat treatment is identical to that of standard silicon and enables better control of the technological operations of photolithography, etching and deposition compared to a polymer material.

An example of method for producing a microelectronic device comprising via-last TSVs with a view to 3D integration, implementing a temporary assembly interface according to the invention, will also be described in relation with FIGS. 8A to 8H.

During a first step, on a substrate 20 for example made of silicon, are produced transistors and a rerouting system according to techniques well known to those skilled in the art. The element 21 thereby obtained is represented in FIG. 8A.

Furthermore, a handle-temporary assembly interface assembly such as that represented in FIG. 1 or in FIG. 2 with an exclusion zone is produced. The layer C1 is for example made of amorphous Si and the layer C2 made of porous Si.

Figure 8A:
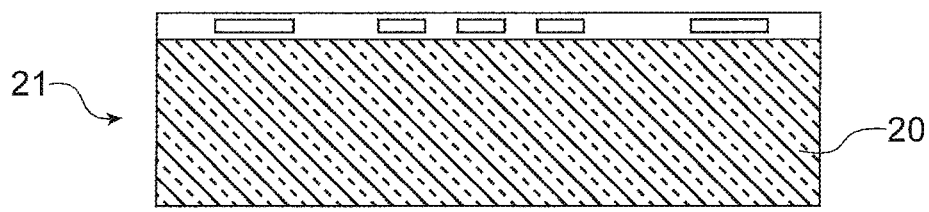
Figure 8B:
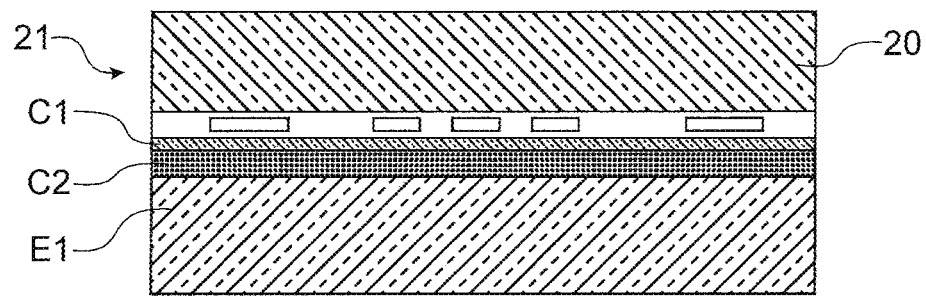

During a following step, the element 218 is turned over and the handle and the element of FIG. 8A are assembled, for example by direct or eutectic bonding on the rear face of the element 21. The element obtained is represented in FIG. 8B. An embrittlement treatment may be applied to the assembly before its assembly with the element 21.

A suitable surface treatment may take place before the surfaces to be assembled are placed in contact. An annealing may be carried out after assembly in order to enable an intimate adhesion and the production of chemical bonds at the interface.

In an advantageous example, the temporary assembly interface comprises an encapsulation layer C3, for example made of $SiO_2$, which contributes to the bonding with the element 18.

Figure 8C:
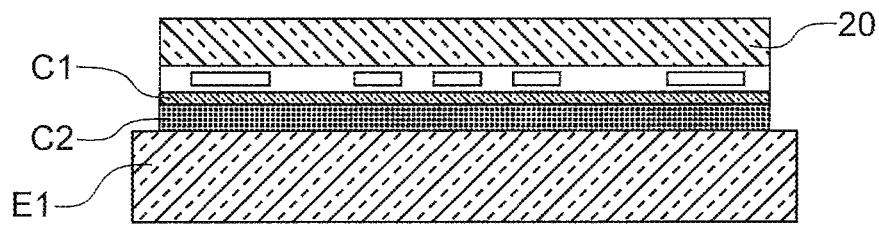

During a following step, the substrate 20 is thinned, for example down to a thickness of 200 μm, for example by chemical mechanical polishing. The element obtained is represented in FIG. 8C.

Figure 8D:
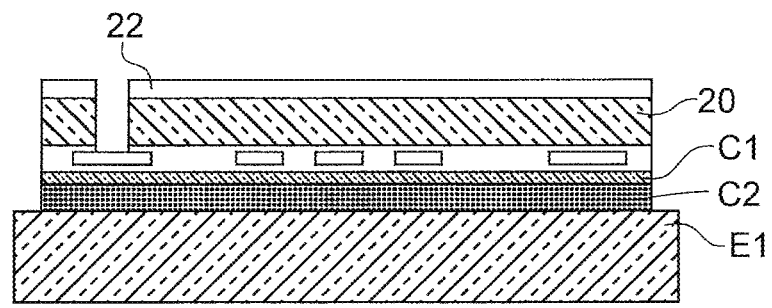
Figure 8E:
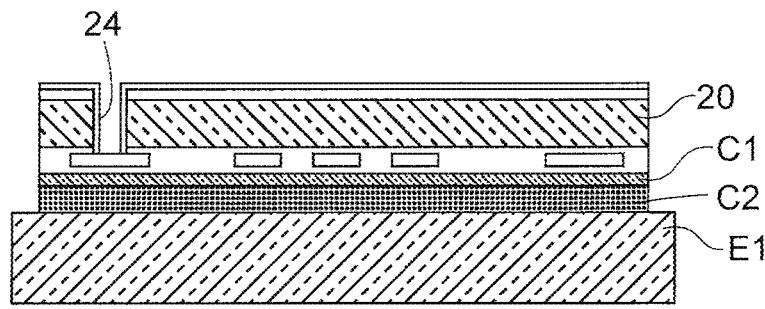
Figure 8F:
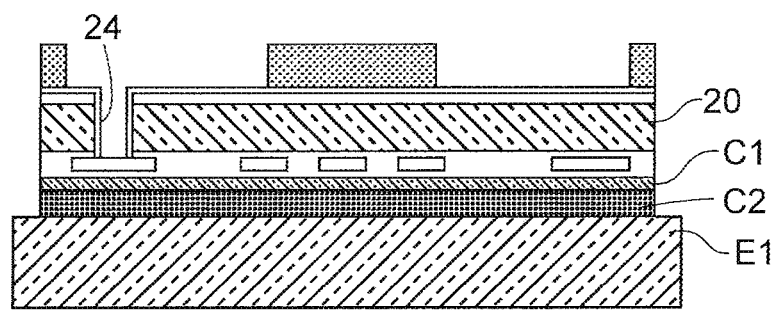
Figure 8G:
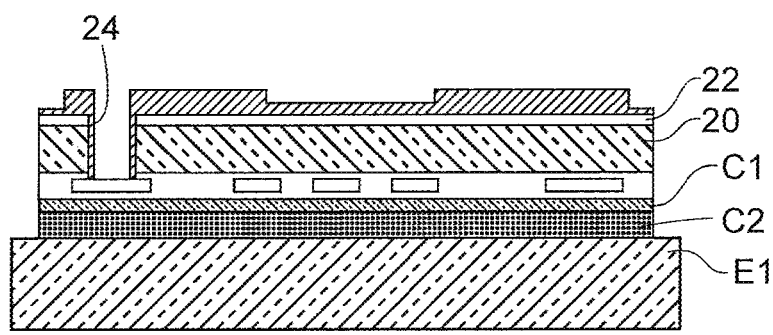

During a following step, the substrate is etched to reach the transistors and the rerouting system. An electrical insulation layer 22 is formed on the substrate 20 20, the layer 22 is open in the bottom of the etching to enable the connection to the transistors and to the rerouting system. The element obtained is represented in FIG. 8D.

During following steps represented in FIGS. 8E to 8H, a through via 24 or TSV last process (through silicon via) and a placing again in contact are notably carried out. These steps are well known to those skilled in the art and are for example described in the document "*Wafer level packaging technology development for CMOS image sensors using through silicon vias*" J. Charbonnier, Proceedings of ESTC 2009 London.

Figure 8H:
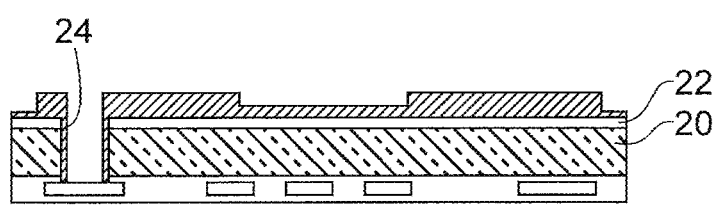

During the step represented in FIG. 8H, the handle is removed for example by peeling. In the case where the temporary assembly interface comprises an exclusion zone, a profiling step takes place before the peeling.

This method implementing a temporary assembly interface according to the invention has, compared to a TSV-last method wherein the handle is assembled by a polymer adhesive, the following advantages:
- easy release of the handle,
- compatibility with methods at temperatures above 300° C.

The present invention may also be implemented in the transfer of at least one thin film of solid material delimited in an initial substrate or a complete integration including for example a routing system, of chips transferred and encapsulated in a moulding material.

The invention claimed is:

1. A production method for producing an interface intended to assemble temporarily a first and a second element, comprising at least:
   a) formation of a first layer comprising at least one material capable of releasing at least one chemical species under action of a physical-chemical treatment,
   b) formation of a second layer comprising at least one material capable of receiving the at least one chemical species so as to cause embrittlement of the second layer, the first layer and a second layer being at least in part in contact,
   wherein the embrittlement comprises obtaining an adherence energy of the second layer to one of the first and second elements along a plane transversal to a stack direction of the first layer and second layer less than or equal to 1 J/m².

2. The production method according to claim 1, wherein the formation of the first layer is such that the at least one chemical species is trapped in the material of the first layer.

3. The production method according to claim 1, wherein the second layer is at least in part porous.

4. The production method according to claim 1 wherein the second layer is at least in part porous and the method further comprises, during the formation of the second layer, producing an external zone having a porosity less than a central zone.

5. The production method according to claim 1, wherein step a) is carried out by deposition of amorphous silicon by chemical vapor deposition or plasma-enhanced chemical vapor deposition, and the second layer is at least in part made of porous silicon.

6. The production method according to claim 1, comprising a chemical treatment of the second layer using one of an oxidation by plasma, an oxidation by liquid process, such as oxidation in a peroxide medium, a gaseous oxidation treatment, and a thermal oxidation treatment.

7. An assembly method for assembling temporarily a first element and a second element comprising:
   production of an interface according to the production method according to claim 1,
   assembly of the first element and the second element through said interface such that the first layer is on a side of the second element and the second layer is on a side of the first element,
   a step of embrittlement of the interface such that the at least one species is released from the first layer and reacts with all or part of the material of the second layer,
   wherein at an end of the embrittlement step an adherence energy of the second layer to the first element along a plane transversal to a stack direction of the first layer and second layer is less than or equal to 1 J/m².

8. The assembly method according to claim 7, wherein the second layer is produced on a front face of the first element.

9. The assembly method according to claim 8, wherein the embrittlement step takes place before the assembly.

10. The assembly method according to claim 8, wherein the embrittlement step is a heat treatment between 250° C. and 500° C.

11. A method for producing at least one part of at least one microelectronic device implementing the assembly method according to claim 8, wherein the first element is a temporary handle and the second element is a microelectronic support, said method comprising a step of removal of the handle after the embrittlement step.

12. A method for producing a thin film implementing the assembly method according to claim 8, wherein the first element is a support substrate and the second element is a thin film, said method comprising a step of removal of the support substrate after the embrittlement step.

13. An interface intended to assemble temporarily a first and second element comprising at least:
   a first layer comprising at least one material capable of releasing at least one chemical species under the action of a physical-chemical treatment, and
   a second layer comprising at least one material capable of receiving the one or more chemical species so as to cause embrittlement of the second layer, wherein an adherence energy of the second layer to one of the first and second elements along a plane transversal to a stack direction of the first layer and second layer is less than or equal to 1.1/m².

14. The interface according to claim 13, in which the first layer is made of amorphous silicon and the second layer is made of porous silicon.

15. The interface according to claim 14, in which the second layer has a porosity comprised between 20% and 80%.

16. The interface according to claim 13, in which a thickness of the first layer is between 100 nm and 10 μm and a thickness of the second layer is between 100 nm and 100 μm.

17. The interface according to claim 13, comprising an encapsulation layer covering the first layer.

18. The interface according to claim 13, comprising an encapsulation layer covering the first layer, said encapsulation layer being made of SiO2.

* * * * *